United States Patent [19]
Chiang

[11] Patent Number: 5,877,552
[45] Date of Patent: Mar. 2, 1999

[54] SEMICONDUCTOR PACKAGE FOR IMPROVING THE CAPABILITY OF SPREADING HEAT AND ELECTRICAL FUNCTION

[75] Inventor: Cheng-Lien Chiang, Taipei, Taiwan

[73] Assignee: Industrial Technology Research Institute, Taiwan

[21] Appl. No.: 880,804

[22] Filed: Jun. 23, 1997

[51] Int. Cl.[6] ............................. H01L 23/10; H01L 23/34
[52] U.S. Cl. ........................... 257/706; 257/707; 257/796
[58] Field of Search ................................... 257/706, 707, 257/787, 718, 719, 796, 691

[56] References Cited

U.S. PATENT DOCUMENTS 5,371,404  12/1994  Juskey et al. ............................ 257/787
5,561,323  10/1996  Andros et al. ........................... 257/706

*Primary Examiner*—Mahshid D. Saadat
*Assistant Examiner*—S. V. Clark
*Attorney, Agent, or Firm*—Pillsbury Madison & Sutro LLP

[57] ABSTRACT

The semiconductor package for improving the efficiency of spreading heat and the capability of electrical function is disclosed. A semiconductor die is attached on the BT substrate by using a conventional die attaching material. The die is electrically coupled to conductive traces on the top surface of the substrate by the bonding wires, a TAB method or a flip chip method. A plurality of conductive vias are also need for electrically coupling conductive traces on the top surface of the substrate to those on the bottom. At an end portion of each conductive trace on the bottom of the substrate is an conductive pad for connecting to a solder ball for transferring electrical signal. A heatspreader is exactly set over the semiconductor die for improve the efficiency of spreading heat. Additionally, the heatspreader is connected on the ground land of the substrate via a conductive adhesives to form a ground plane. The transmission lines either set between the heatspreader and another ground plane at the bottom of the substrate or set one the same side of two ground planes are served as a strip line structure or a mircostrip line structure, respectively. Therefore, the induction of package itself will be improved and the clock speed of package device will be increased.

8 Claims, 5 Drawing Sheets

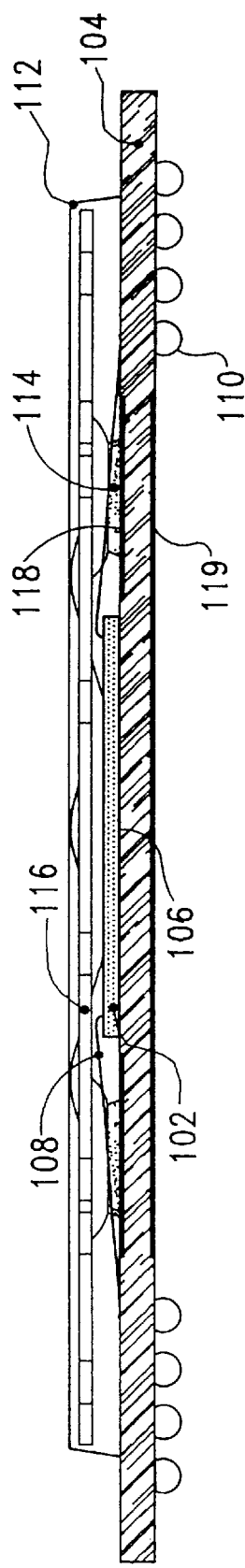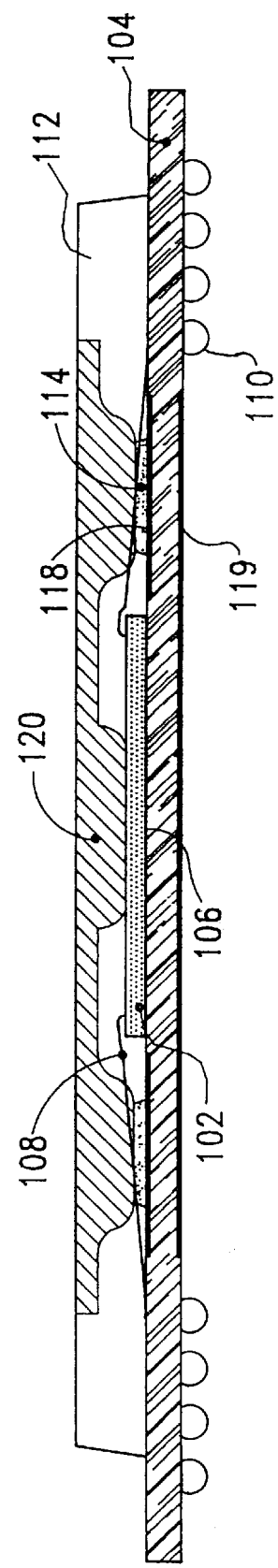

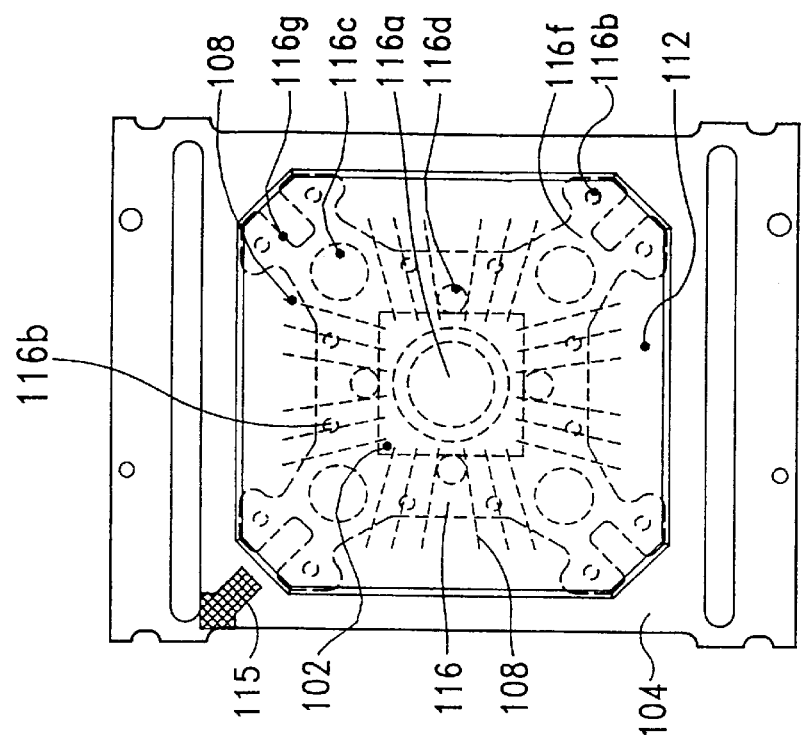
FIG.3C
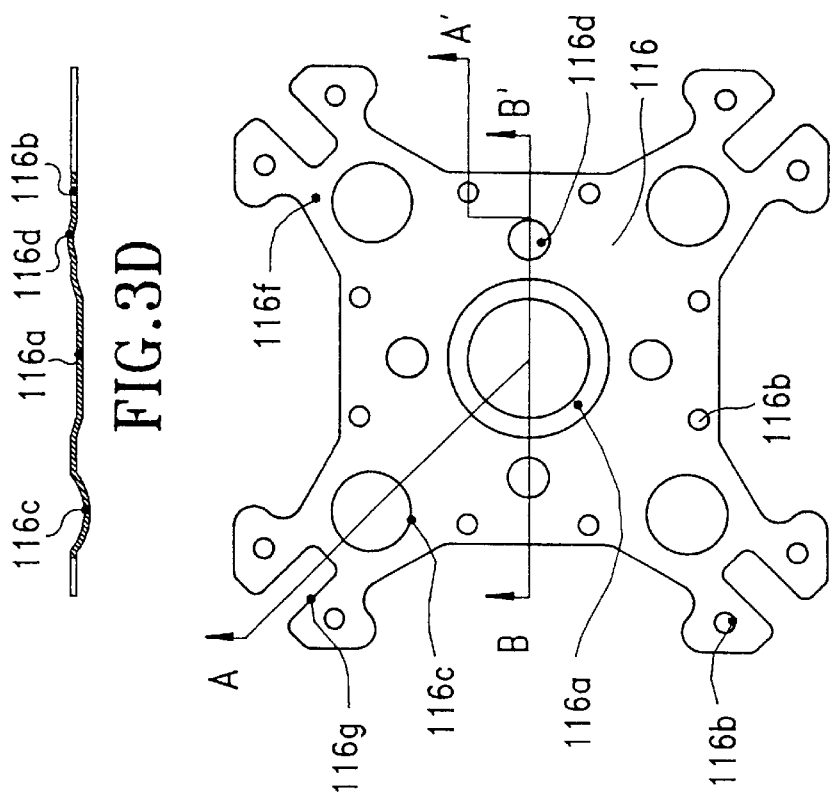
FIG.3D
FIG.3B
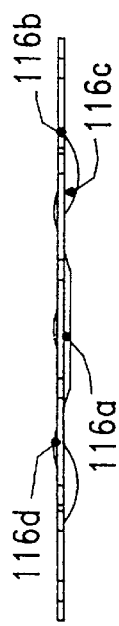
FIG.3E

SEMICONDUCTOR PACKAGE FOR IMPROVING THE CAPABILITY OF SPREADING HEAT AND ELECTRICAL FUNCTION

CROSS REFERENCE TO RELATED APPLICATION

This invention is related to U.S. Patent application entitled "SEMICONDUCTOR PACKAGE FOR IMPROVING THE CAPABILITY OF SPREADING HEAT" (Application Ser. No. 08/772,670) assigned to same assignee as the present application and incorporated herein by reference in its entirety.

BACKGROUND OF THE INVENTION

1. Field of the Invention

The present invention relates to a semiconductor package, and more specifically, to a package which can improve the efficiency of spreading heat and the capability of electrical function.

2. Description of the Prior Art

With the rapid advances in wafer fabrication process technology, developments in interconnection and packing have been quite modest in comparison. The renewed interest in high density hybrid is driven by the requirement to handle large numbers of IC interconnections, the increasing clock rate of digital systems and the desire to pack greater functionality into smaller spaces. Therefore, the number of a package's leads becomes more and more. An important consideration in making small, high speed and high density devices is providing packages capable of spreading heat generated by the devices. A further problem confronting the technology is the relentless need for more I/O per chip. A conventional leadframe package, such as SOP, PQFP, has a limitation to increase the number of the package's lead. In addition, the maximum speed of the leadframe package is less than 100 MHz, that can not meet the manufacturers' desire. One response to the requirement of providing packages for high speed and density devices has been developed. One such package type is plastic ball grid array (PBGA) that uses a bismaleimidetraizine (BT) as a substrate. The PBGA offers many advantages over conventional packages such as solder ball I/O and high speed. The PBGA package has high speed due to a short path for signal transformation. The solder balls are set on a package surface in a matrix array which can provide more signal contacts. Although the PBGA has a shorter path for spreading heat than a conventional package, but a heat spreader or a heat slug can not be set on the backside of a die paddle due to the structure of the PBGA. Further, the substrate of the PBGA is made of BT so that the efficiency of spreading heat is poorer than the leadframe package. As shown in FIG. 1, in order to solve the problem, pad array semiconductor devices have been proposed (see US. Pat. No. 5,285,352). Use of a thermal conductor 2 in a pad array device permits routing of conductive traces 4 and terminals beneath a semiconductor die for improved utilization of substrate 6 area. An opening 8 and thermal conductor 2 are set under the die 10 on BT substrate 6. The heat that is generated by devices is dissipated to computer board via silver epoxy 12, the opening 8 and a metal ground plane 14. Solder balls are represent by 16. Although the structure provides a shorter path than conventional leakframe package for spreading heat, the efficiency of spreading heat still has limination. Therefore, it will be an important consideration in the present invention for providing a package structure with a better efficiency of spreading heat.

Additionally, It also is an important consideration in the prevent invention for improving the efficiency of electrical function of package. Typically, the electrical function in the PBGA package is improved to increase the clock speed of package devices by two method such as the reduction of resistance for IC device or the reduction of induction for the PBGA package. With the increasing of the numbers of the I/O interconnections, the density of the semiconductor devices becomes more higher. The inter-resistance of the IC device will increase so that the speed of IC device will be reduced. Therefore, a method to solve the problem is either redesigning the IC device or decreasing the size of IC device in a delicate process. However, these methods to improve the clock speed of the package devices always cause an undesired result without a suitable package structure. In consideration of both cost and electrical function, the reduction of induction of the package itself becomes more important. The present invention will utilizes a strip line structure or a mircostrip line structure to improve electrical function for reducing induction of the package. Referring to FIG. 2A, it shows a strip line structure view. The current is inputted to a transmission line 20 such that the magnetic induction will be generated. Because the other transmission lines also have the same state to create the magnetic induction when the current are inputted to them, the magnetic induction from the transmission lines will be interfered one another. That results in the impedance of the transmission lines increasing. At this time, if the transmission line 20 is set between a ground plane 22 and another ground plane 24, the magnetic induction from the transmission line 20 will be absorbed by two ground planes. Therefore, the induction of the transmission line is reduced to increase the speed of the transmission line. Furthermore, referring to FIG. 2B shows a mircostrip line structure view. A transmission line 30 is set on the same side of two ground planes 32 and 34. The magnetic induction from the transmission line 30 also can be absorbed by two ground planes. Therefore, the present invention according to this circuit structure will efficiently improve the electrical function of package. The induction of the transmission line will be reduced so that the speed of the transmission line will be increased.

SUMMARY OF THE INVENTION

It is a primary object of the present invention to provide a package which can improve the efficiency of spreading heat and the capability of electrical function. A heatspreader is set over a die and is adhered to the ground land of BT substrate by using a conductive adhesive.

The present invention discloses a way of enhancing the method to increase the efficiency of spreading heat and the capability of electrical function. In the present invention, heat is dissipated out of a die only via a heatspreader and a package body, that provides a shorter path than conventional one for spreading heat. The structure of the present invention will not change the current formation of forming a package. The order of pin arrangement of the present invention is the same with present method and is compatible with a printed circuit board (pcb). The feature of the present invention is a heatspreader that is set over a die instead of being set under the die and the heatspreader is adhered to at least one ground land of BT substrate by using a conductive adhesive. The ground land of BT substrate set on the top surface of the BT substrate is electrically coupled to a ground plane of BT substrate set on the bottom surface of the BT substrate via a plurality of conductive vias.

A package includes a semiconductor die mounted to a top surface of a substrate. The die and a portion of the substrate are connected by using silver epoxy. A plurality of bonding wires are attached on the die. Further, conductive traces are on the top surface of the substrate. Solder balls that are set at the bottom surface of the substrate. In general, the solder balls are arranged in a matrix array configuration. A heatspreader is exactly set over the semiconductor die for spreading heat. It is different from the conventional heatspreader that is set under a die. The die, the heatspreader and BT substrate are encapsulated in a package body.

In first embodiment, the heatspreader is a square metal plane having four first supporters that are at the corners and along the diagonal lines protruding from the square metal plane. The first supporters are used to prevent the die from being moved and damaged while the heatspreader is set in the cavity of the package body. The first supporters are respectively mounted at the four corners of the cavity. The heatspreader has a shallow dish-like cavity. Suitable downset of the cavity can prevent the bonding wires from being damaged by the heatspreader. The bottom of the shallow cavity contacts the top surface of the die to dissipate heat from the die. Four hemispherical cavities are on the surface of the heatspreader to protect the die. Four hemispherical cavities are connected to the top surface of the ground land of the substrate by using a conductive adhesive as second supporters of the heatspreader. The downset of the hemispherical cavity is deeper than the one of the shallow dish-like cavity. Four hemispherical hills are also on the top surface of the heatspreader for connecting to the package body to serve as third supporters. A plurality of openings are set on the edge surface of the heatspreader for reducing delamination. Four second supporters of the heatspreader are attached to the ground lands of the BT substrate by using the conductive adhesive to form a ground plane. Therefore, all transmission lines between the heatspreader and a ground plane at the bottom of the substrate are served as a strip line structure, and the transmission lines on the same side of the heatspreader and the ground plane of the substrate are served as a mircostrip line structure. At this time, the induction of the package itself is reduced to increase the clock speed of package device.

In a second embodiment, a heat slug is instead of the heatspreader. A shallow dash-like convex is at the center of the heat slug for attaching to the top surface of the die. The heat from the die is dissipated outside by the heat slug. Suitable thickness of the shallow convex can prevent the bonding wires from being damaged by the heat slug. Four hemispherical convexes are on the surface of the heat slug to protect the die. Four hemispherical convexes are connected to the top surface of the ground land of the substrate by using a conductive adhesive as supporters of the heat slug. The thickness of the hemispherical convex is thicker than the one of the shallow dish-like convex. Four supporters of the heat slug are attached to the ground lands of the BT substrate by using the conductive adhesive to from a ground plane. Therefore, all transmission lines between the heat slug and a ground plane at the bottom of the substrate are served as a strip line structure, and the transmission lines on the same side of the heat slug and the ground plane of the substrate are served as a mircostrip line structure. At this time, the induction of the package itself is reduced to increase the clock speed of package device.

BRIEF DESCRIPTION OF THE DRAWINGS

FIG. 3A is a cross section view of the structure of a package according to the first embodiment;

FIG. 3B is the top view of a heatspreader according to the first embodiment;

FIG. 3C is a top view of the structure of a package according to the first embodiment;

FIG. 3D is a cross section view of the heatspreader according to the line A-A' of FIG. 3B;

FIG. 3E is a cross section view of the heatspreader according to the line B-B' of FIG. 3B;

FIG. 4A is a cross section view of the structure of a package according to the second embodiment;

DESCRIPTION OF THE PREFERRED EMBODIMENT

Figure 1:
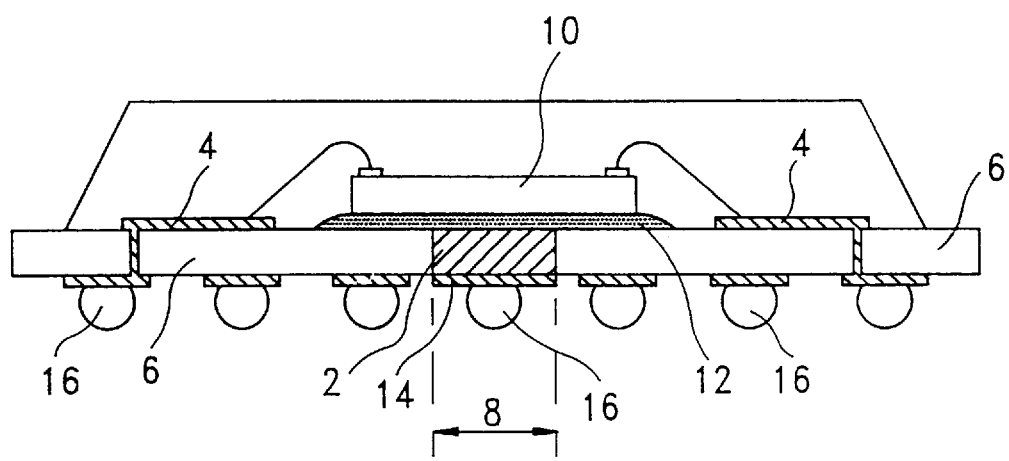
FIG. 1 is a cross section view of a structure of a prior art.
Figure 2A:
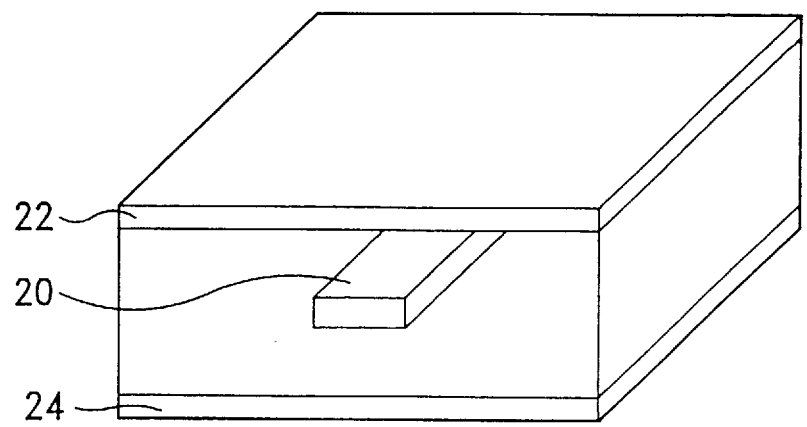
FIG. 2A is a structure view of a strip line structure.
Figure 2B:
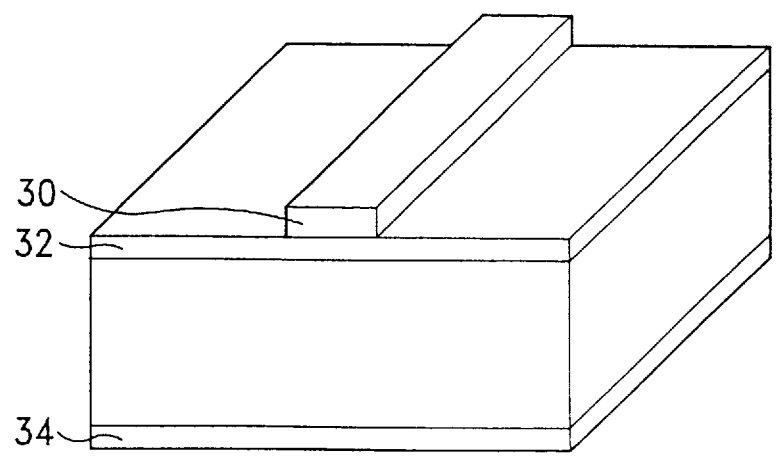
FIG. 2B is a structure view of a mircostrip line structure.

The present invention discloses a way of enhancing the method to increase the efficiency of spreading heat and the capability of electrical function. The feature of the present invention is a heatspreader that is set over a die instead of being set under the die. In a conventional package, the heat is spread from the die via six layers of material that are silver epoxy, a conductive opening, a substrate, a metal plate, solder balls and a print circuit board (pcb). It only needs three layers of material that are silver epoxy, heatspreader and molding compound to dissipate heat in the present invention. Additionally, it is also important to improve the capability of electrical function. The heatspreader is set over the die and connected to the top surface of a ground land of BT substrate by using a conductive adhesive. The ground land of BT substrate set on the top surface of the BT substrate is electrically coupled to a ground plane of BT substrate set on the bottom surface of the BT substrate through a plurality of conductive vias. Therefore, the heatspreader connected the ground land of BT substrate can serve as a ground plane. At this time, all transmission lines between two ground planes can be generated a strip line structure or a mircostrip line structure. Therefore, the induction of the package itself will be reduced, and the clock speed of package device will be increased.

Referring to FIG. 3A, it is a cross section view of a first embodiment of the present invention. A package includes a semiconductor die 102 attached to a die receiving area on the top surface of a substrate 104. Typically, the substrate 104 is made of BT (bismaleimidetraizine), it will be appreciated that any suitable material can be used as the substrate 104. The die 102 and a portion of the substrate 104 are connected by using a conventional die attaching material 106, such as silver epoxy. General speaking, the die 102 will be a memory or IC, which generates a lot of heat during operation. A plurality of bonding wires 108 are attached on the die 102. Further, conductive traces is on the top surface of the substrate 104. In many cases, conductive traces are also on a bottom surface of the substrate 104. The die 102 is electrically coupled to conductive traces by the bonding wires 108 or other well known coupling methods such as a TAB method, a flip chip method. A plurality of conductive vias are also needed for electrically coupling conductive traces on the top surface of the substrate 104 to those on the bottom. Typically, at an end portion of each conductive trace at the bottom of the substrate 104 is a conductive pad for connecting to a solder ball 110. In preferred embodiment, the conductive traces and pad are made of copper or any conductive metal. Solder balls 110 are terminal of a device which permit electrical signal transfer to the die 102. In general, the solder balls 110 are arranged in a matrix array configuration. The die 102 and portions of the substrate 104 are encapsulated in a package body 112. In the present invention, package also includes a heatspreader 116 that is exactly set over the semiconductor die 102 for spreading heat. It is different from the conventional heatspreader that is set under a die.

Referring to FIG. 3B and FIG. 3C, the heatspreader 116 is a square (or rectangular) metal plane having four trapezoid shape first supporters 116f that are at the corners and along the diagonal lines protruded from the square (or rectangular) metal plane. The first supporters 116f are used to prevent the die 102 from being moved and being damaged while the heatspreader 116 is set in the package body 112. The supporters 116f are respectively mounted at the four corners of the cavity. Each supporter 116f has a rectangular indented portion 116g which is parallel to the transfer molding direction 115 for improving the molding compound completely filled in the package body and reducing delamination. The heatspreader 116 has a shallow dish-like cavity 116a at the center portion of the heatspreader 116. Suitable downset of the cavity 116a can prevent the bonding wires 108 from being damaged by the heatspreader 116. The bottom of the shallow cavity 116a contacts the top surface of the die 102 to dissipate heat from the die 102. Four hemispherical cavities 116c are on the surface of the heatspreader 116 to protect the die 102 and connected to the top surface of the ground lands 118 of the substrate 104 as second supporters of the heatspreader 116. The downset of the hemispherical cavity 116c is deeper than the one of the shallow dish-like cavity 116a. In the preferred embodiment, the hemispherical cavities 116c are close to the corners of the heatspreader 116, respectively. Further, from the top view, the centers of the cavities 116c are located on the diagonal lines. Four hemispherical hills 116d are also on the top surface of the heatspreader 116 adjacent to the die 102 for connecting to the package body 112 to serve as third supporters. Four third supporters 116d are connected to the package body 112 to prevent the heatspreader 116 from moving. In the preferred embodiment, a plurality of openings 116b are set at the edge of the heatspreader 116. The openings 116b are used to let the molding compound be completely filled in the package body 112 and reduce delamination.

The method of packaging is used to coat a conductive adhesives 114 on the top surface of the ground land 118 of BT substrate 104. The heatspreader 116 is set on the substrate 104 which the die 102 has been completed the steps of die bonding and wire bonding and attached on the substrate 104. Four second supporters 116c of the heatspreader 116 are mounted on the top surface of the ground land 118 of substrate 104. The conductive adhesive 114 can adhere and fix the heatspreader 116 on the substrate 104. Furthermore, the entire heatspreader 116 is buried in the package body 112 by using a transfer molding. At this time, the convex portion of the hemispherical cavities 116c must be polished to expose metal surface for electrically connecting to the conductive adhesive 114. The polished second supporters 116c can improve the planalization and remove the oxide layer, insulator layer on the convex surface of the second supporters 116c. Therefore, the heatspreader 116 connected with the ground land 118 by the conductive adhesive 114 can be served as a ground plane. The heatspreader 116 can not be moved at the direction of transfer molding. The suitable downset of the hemispherical cavity 116c can remain a little space between the heatspreader 116 and the die 112 to prevent the die damaged while clamping mold process is performed. Additionally, all transmission lines between the heatspreader 116 and a ground plane 119 at the bottom of the substrate 114 are served as a strip line structure. Further, the transmission lines are set on the same side of two ground plants as a mircostrip line structure. Therefore, the magnetic induction from the transmission lines will be absorbed by two ground planes. That results in the induction of the package itself reduced and the clock speed of package device increased. The line A-A' and B-B' of the FIG. 3B represent the portion of the heatspreader 116 through which the cross section views FIG. 3D and 3E are taken.

Referring to FIG. 4A shows a second embodiment of the present invention. It can be seen in the drawing, a heatspreader is replaced by a heat slug 120 and the heat slug 120 is also attached on the die 102 via a die attaching material such as epoxy. The elements of the package are all the same with the first embodiment except the shape of the heat slug 120 and the way to mount it on the die 102.

Figure 4C:
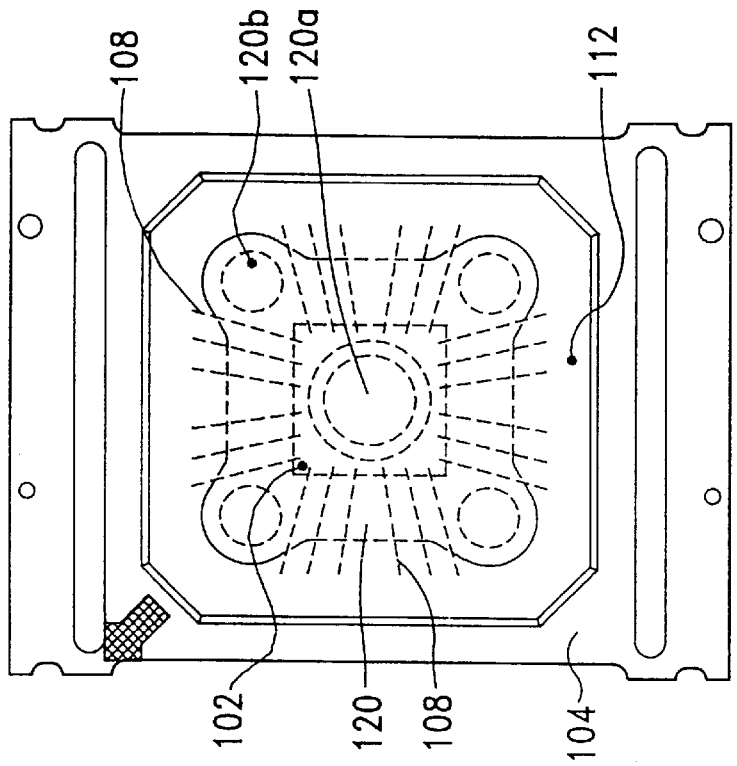
FIG. 4C is a top view of the structure of a package according to the second embodiment.
Figures 4B, 4D, 4E:
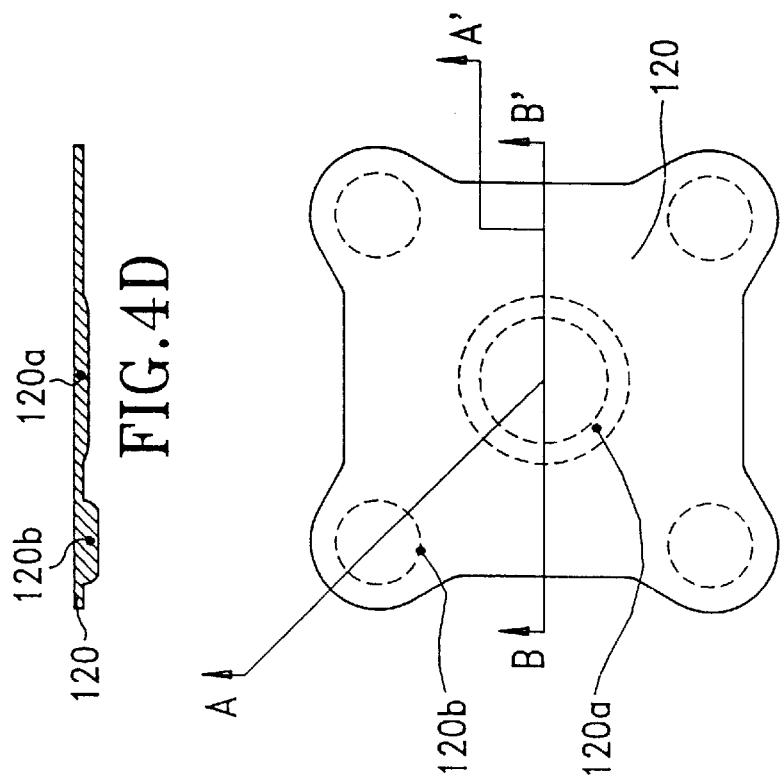
FIG. 4B is the top view of a heat slug according to the second embodiment.
FIG. 4D is a cross section view of the heat slug according to the line A-A' of FIG. 4B.
FIG. 4E is a cross section view of the heat slug according to the line B-B' of FIG. 4B.

Referring to FIG. 4B and FIG. 4C, the heat slug 120 is made of a metal material. A shallow dish like convex 120a is at the center of the heat slug 120 for attaching to the top surface of the die 102. The bottom of the shallow convex 120a contacts the top surface of the die 102 to dissipate heat from the die 102. Suitable thickness of the shallow convex 120a can prevent the bonding wires 108 from being damaged by the heat slug 120. Four hemispherical convexes 120b are on the surface of the heat slug 120 to protect the die 102. Four hemispherical convexes 120b are connected to the top surface of the ground land 118 of the substrate 104 by using a conductive adhesive 118 as supporters of the heat slug 120. The thickness of the hemispherical convex 120b is thinner than the one of the shallow dish-like convex 120a. In the preferred embodiment, the hemispherical convexes 120b are closed to the corners of the heat slug 120, respectively. Further, from the top view, the centers of the hemispherical convexes 120b are located on the diagonal lines.

The method of packaging is used to coat a conductive adhesive 114 on the top surface of the ground land 118 of BT substrate 104. The heat slug 120 is set on the substrate 104 which the die 102 has been completed the steps of die bonding and wire bonding and attached to the substrate 104. Four supporters 120b of the heat slug 120 is mounted on the top surface of the ground land 118 of substrate 104. The conductive adhesive 114 can adhere and fix the heat slug 120 on the substrate 104. Furthermore, a portion of the heat slug 120 is buried in the package body 112 by using a transfer molding, and the top surface of the heat slug 120 is exposed. At this time, the hemispherical convexes 120b are electrically connected to the conductive adhesive 114. Therefore, the heat slug 120 is connected on the ground land 118 by the conductive adhesive 114 to serve as a ground plane. The heat slug 120 can not be moved in the direction of transfer molding, and the suitable thickness of the hemispherical convex 120b can remain a little space between the heat slug 120 and the die 102 to prevent the die 102 damaged while clamping mold process is performed. Therefore, all transmission lines between the heat slug 120 and a ground plane 119 at the bottom of the substrate 114 are served as a strip line structure. Further, the transmission lines set on the same side of two ground planes are served as a mircostrip line structure. The magnetic induction from the transmission lines will be absorbed by two ground planes. That results in the induction of the package itself reduced and the clock speed of package device increased. The line A-A' and B-B' of the FIG. 4B represent the portion of the heat slug 120 through which the cross section views FIG. 4D and 4E are taken.

Although specific embodiments including the preferred embodiment have been illustrated and described, it will be obvious to those skilled in the art that various modifications may be made without departing from the spirit and scope of the present invention, which is intended to be limited solely by the appended claims.

What is claimed is:

1. A structure of a semiconductor package, said structure comprising:

a substrate having a top and a bottom surface, a die receiving area, a plurality of conductive traces, a plurality of ground lands on the top surface and a ground plane on the bottom surface;

a semiconductor die mounted to said substrate within said die receiving area for electrically coupling said die to said conductive traces;

a signal transferring means, set on the bottom surface of said substrate, for conducting an electrical signal to said die;

means for spreading heat mounted over said die, said heat spreading means comprising:

at least one metal plane for spreading heat attached to said die, a first portion of said metal plane being shaped so as to form a dish-like cavity having a first downset on the surface of said plane for protecting bonding wires and for mounting to the surface of said die via a die attaching material, said plane being shaped so as to define a plurality of first supporters protruding from said plane for improving the capability of support and preventing delamination.

said plane being shaped so as to define a second supporter of said plane for connecting to said plurality of ground lands and to said substrate, said plane being shaped so as to define a plurality of third supporters to prevent said heat spreading means from moving, and said plane being shaped so as to define a plurality of first openings formed at the edge of said plane for letting a molding compound being filled within said first portion of said metal plane to reduce delamination;

a conductive adhesive for attaching and fixing said heat spreading means, said heat spreading means connected to said plurality of ground lands via said conductive adhesive; and means for covering said die mounted to said substrate, said die and said heat spreading means being within said covering means.

2. The structure of claim 1, wherein said dish-like cavity is set on the surface at the center of said metal plane.

3. The structure of claim 1, wherein said first supporter has a indented portion that is parallel to a transfer molding direction.

4. The structure of claim 1, wherein said second supporter is a hemispherical cavity having a second downset and is set close to the corners of said metal plane, said second downset being deeper than said first downset.

5. The structure of claim 1, wherein said third supported is a hemispherical hill adjacent to said die.

6. A structure of a semiconductor package, said structure comprising:

a substrate having a top and a bottom surface, a die receiving area, a plurality of conductive traces, a plurality of ground lands on the top surface and a ground plane on the bottom surface;

a semiconductor die mounted to said substrate within said die receiving area for electrically coupling said die to said conductive traces;

a signal transferring means, set on the bottom surface of said substrate, for conducting an electrical signal to said die;

means for spreading heat mounted over said die, said heat spreading means comprising:

a slug for spreading heat attached to said die, a first portion of said slug being shaped so as to form a dish-like convex having a first thickness for protecting bonding wires and for mounting to the surface of said die via a die attaching material, and said slug being shaped so as to define at least one second portion, for connecting to said plurality of ground lands and to said substrate, as a supporter;

a conductive adhesive for attaching and fixing said heat spreading means, said heat spreading means connected to said plurality of ground lands via said conductive adhesive; and means for covering said die mounted to said substrate, said die and said heat spreading means being within said first portion.

7. The structure of claim 6, wherein said dish-like convex is at the center of said slug.

8. The structure of claim 6, wherein the second portion of said slug is a hemispherical convex having a second thickness and is set close to the corners of said slug, said second thickness being thicker than said first thickness.

* * * * *